United States Patent
Cheng et al.

(10) Patent No.: US 7,911,059 B2
(45) Date of Patent: Mar. 22, 2011

(54) HIGH THERMAL CONDUCTIVITY SUBSTRATE FOR A SEMICONDUCTOR DEVICE

(75) Inventors: Ching-Tai Cheng, Hsinchu (TW); Jui-Kang Yen, Taipei (TW)

(73) Assignee: SeniLEDS Optoelectronics Co., Ltd, Chu-Nan (TW)

(*) Notice: Subject to any disclaimer, the term of this patent is extended or adjusted under 35 U.S.C. 154(b) by 20 days.

(21) Appl. No.: 11/760,369

(22) Filed: Jun. 8, 2007

(65) Prior Publication Data

US 2008/0303157 A1 Dec. 11, 2008

(51) Int. Cl.
*H01L 23/52* (2006.01)
*H01L 21/00* (2006.01)

(52) U.S. Cl. ......... 257/758; 257/E23.141; 257/E21.001; 257/712; 257/713; 257/717; 257/720; 257/707; 257/711; 257/704; 257/675; 257/668; 257/774; 257/680

(58) Field of Classification Search ............ 257/99, 257/703, 771, 758, E23.141, E21.001, 712, 257/713, 717, 720, 707, 711, 704, 675, 668, 257/774, 680; 428/209, 210; 156/89.12; 438/123

See application file for complete search history.

(56) References Cited

U.S. PATENT DOCUMENTS

| | | | |
|---|---|---|---|
| 5,475,264 A * | 12/1995 | Sudo et al. ............ | 257/723 |
| 5,506,755 A * | 4/1996 | Miyagi et al. .......... | 361/720 |
| 5,847,935 A | 12/1998 | Thaler et al. | |
| 5,883,428 A * | 3/1999 | Kabumoto et al. ...... | 257/691 |
| 6,118,502 A | 9/2000 | Yamazaki et al. | |
| 6,121,637 A * | 9/2000 | Isokawa et al. ........ | 257/99 |
| 6,711,813 B1 * | 3/2004 | Beyne et al. .......... | 29/852 |
| 6,713,862 B2 | 3/2004 | Palanisamy et al. | |
| 2004/0159919 A1 * | 8/2004 | Doi et al. ............. | 257/676 |
| 2006/0200958 A1 * | 9/2006 | deRochemont et al. ... | 29/25.41 |
| 2007/0228541 A1 * | 10/2007 | Lin et al. ............. | 257/684 |
| 2007/0262387 A1 * | 11/2007 | Nonaka et al. ........ | 257/356 |
| 2007/0297108 A1 * | 12/2007 | Collins et al. ........ | 361/56 |
| 2009/0126903 A1 * | 5/2009 | Kuibira et al. ....... | 165/67 |

FOREIGN PATENT DOCUMENTS

| | | |
|---|---|---|
| JP | 10215001 | 8/1998 |
| JP | 2002232017 | 8/2002 |
| JP | 2005101616 | 4/2005 |
| JP | 2006206963 | * 8/2006 |

OTHER PUBLICATIONS

Peter Van Zant, Microchip Fabrication, 2000, McGraw-Hill, Fourth Edition, pp. 400 and 401.*
U.S. Appl. No. 11/382,296, filed May 9, 2006.

* cited by examiner

*Primary Examiner* — Alexander O Williams
(74) *Attorney, Agent, or Firm* — Patterson & Sheridan, L.L.P.

(57) ABSTRACT

A method and apparatus for packaging semiconductor dies for increased thermal conductivity and simpler fabrication when compared to conventional semiconductor packaging techniques are provided. The packaging techniques described herein may be suitable for various semiconductor devices, such as light-emitting diodes (LEDs), central processing units (CPUs), graphics processing units (GPUs), microcontroller units (MCUs), and digital signal processors (DSPs). For some embodiments, the package includes a ceramic substrate having an upper cavity with one or more semiconductor dies disposed therein and having a lower cavity with one or more metal layers deposited therein to dissipate heat away from the semiconductor dies. For other embodiments, the package includes a ceramic substrate having an upper cavity with one or more semiconductor dies disposed therein and having a lower surface with one or more metal layers deposited thereon for efficient heat dissipation.

29 Claims, 9 Drawing Sheets

HIGH THERMAL CONDUCTIVITY SUBSTRATE FOR A SEMICONDUCTOR DEVICE

BACKGROUND OF THE INVENTION

1. Field of the Invention

Embodiments of the present invention generally relate to semiconductor device packaging and, more particularly, to semiconductor packaging for heat dissipation away from the semiconductor die(s).

2. Description of the Related Art

Heat transfer management is a concern for designers of semiconductor devices from simple devices, such as light-emitting diodes (LEDs), to more complex devices, such as central processing units (CPUs). When such devices are driven with high currents, high device temperatures may occur because of insufficient heat transfer from the p-n junctions of the semiconductor die to the ambient environment. Such high temperatures may harm the semiconductor and lead to such degradations as accelerated aging, separation of the die from the lead frame, and breakage of bond wires.

For an LED, in addition to the aforementioned problems, the optical properties of the LED vary with temperature, as well. As an example, the light output of an LED typically decreases with increased junction temperature. Also, the emitted wavelength can change with temperature due to a change in the semiconductor bandgap energy.

Figure 1:
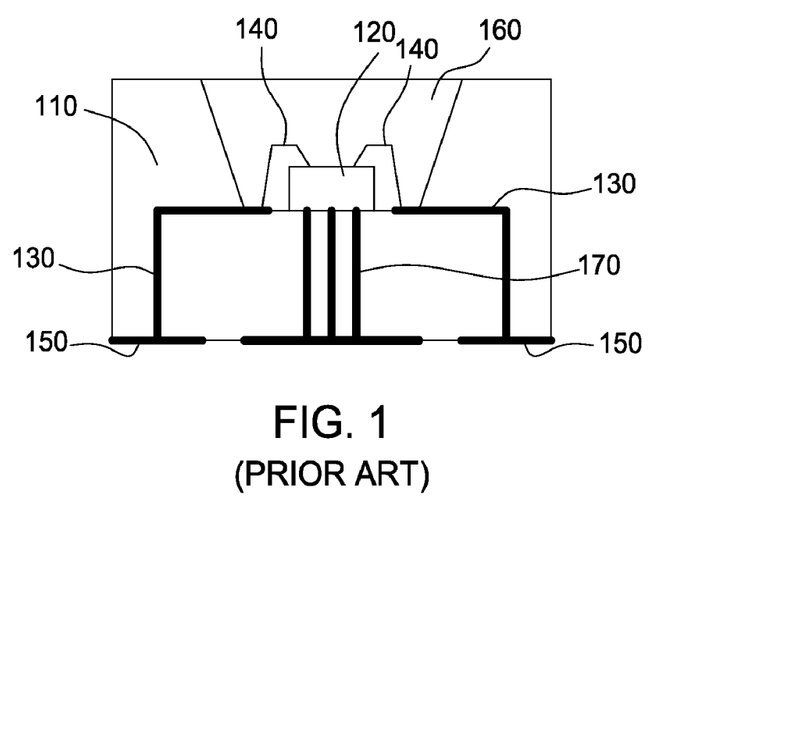
FIG. 1 illustrates a cross-sectional schematic view of a prior art light-emitting diode (LED) device with an LED die disposed within a ceramic substrate and coupled to electrical conductive thermal vias for heat dissipation.

The main path for heat dissipation (thermal path) in semiconductor devices encased in ceramic packages 110 (e.g., low temperature cofired ceramic (LTCC) or alumina) of the prior art, as shown in FIG. 1, is from the p-n junctions of one or more semiconductor dies 120 to the lead frame 130 via bond wires 140 and then through the ends of the leads (i.e., the terminals 150) via heat conduction. At the terminals 150 heat conduction, convection, and radiation serve to transfer heat away from the semiconductor device when mounted on a printed circuit board (PCB), for example. There is also a secondary path of heat conduction from the surfaces of the semiconductor dies 120 to surfaces of the ceramic package 110 or, in some cases, encapsulation materials 160.

One problem with this design described thus far is that the majority of the lead frame 130 is situated within the ceramic package 110, which acts as a thermal insulator, and the main path for heat dissipation out of the device is limited by the size of the leads. Even designs that have added to the size or number of leads in an effort to promote heat transfer still possess an inherent bottleneck for heat dissipation, as the leads are still sandwiched in the thermally insulative ceramic package 110.

To mitigate this bottleneck, designers have added electrically conductive thermal vias 170 disposed in a bottom portion of the ceramic package underneath the semiconductor dies 120 in an effort to provide improved heat dissipation away from the dies 120 through the growth substrate (e.g., silicon, sapphire, silicon carbide, and gallium arsenide) and the thermal vias 170 to a printed circuit board (PCB), heat sink, or other suitable entity on which the electronic device is mounted. However, the insulative properties of the growth substrate and the ceramic package 110 surrounding the thermal vias 170 limit the potential heat transfer.

Figure 2:
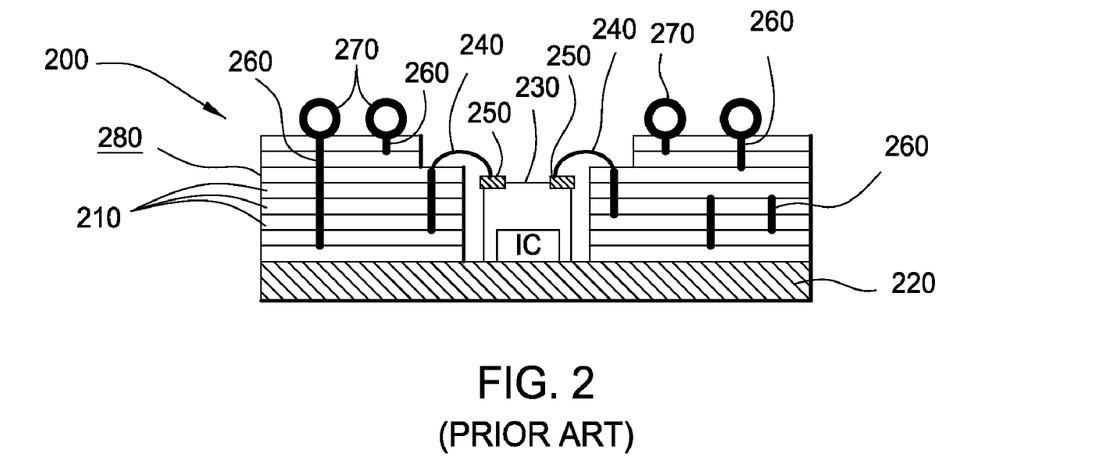
FIG. 2 illustrates a cross-sectional view of a prior art package for an electronic component comprising a metal base plate bonded to a ceramic substrate.

Another conventional thermally conductive package 200 for electronic components is illustrated in FIG. 2. This package 200 consists of a plurality of electrically insulative layers 210 of glass or ceramic bonded to a metal base plate 220. The semiconductor die(s) 230 are mounted on the base plate 220, and then bond wires 240 are used to connect the contact pads 250 of the die(s) 230 to vias 260. Because the base plate 220 is bonded to the bottom of the stack of insulative layers 210, terminals 270 for mounting to a PCB may be located at the top of the package 200.

To form the package 200, layers of green tape composed of glass particles in a binder are formed. Openings or holes may be punched or cut to provide for any desired openings (e.g., an opening for mounting the semiconductor die 230) or vias 260 in the package. The layers of green tapes are then stacked on each other and on the surface of the base plate 220. This assembly is then fired at a temperature which drives off the binder and melts the glass particles to form a glass or ceramic body 280. In this process, the temperature is restricted to the metal materials of the base plate. In other words, the coefficient of thermal expansion (CTE) should be similar between the metals of the base plate 220 and the green tape layers of the body 280, and the firing temperature must be less than 1000° C.

Accordingly, what is needed is a technique to packaging semiconductor devices that increases heat dissipation and simplifies the manufacturing process when compared to conventional packaging techniques, preferably while allowing for higher firing temperatures.

SUMMARY OF THE INVENTION

Embodiments of the present invention generally provide techniques for packaging semiconductor dies for increased thermal conductivity and simpler fabrication when compared to conventional semiconductor packaging techniques.

One embodiment of the present invention provides a packaged semiconductor device. The packaged device generally includes a ceramic substrate having an upper surface and a lower surface, a semiconductor die disposed above the upper surface, and one or more metal layers deposited adjacent to the lower surface for dissipating heat away from the semiconductor die.

Another embodiment of the present invention provides a method for fabricating semiconductor device with a thermally conductive package. The method generally includes providing a ceramic substrate having an upper surface and a lower surface, disposing a semiconductor die above the upper surface of the ceramic substrate, and depositing one or more metal layers adjacent to the lower surface of the ceramic substrate for dissipating heat away from the semiconductor die.

Yet another embodiment of the present invention provides a method for fabricating a semiconductor device with a thermally conductive package. The method generally includes stacking a plurality of green tape layers; cofiring the plurality of green tape layers to yield a ceramic substrate having an upper surface and a lower surface; adding a lead frame to the ceramic substrate; coupling a semiconductor die to the lead frame such that the semiconductor die is disposed above the upper surface of the ceramic substrate; and depositing one or more metal layers adjacent to the lower surface of the ceramic substrate for dissipating heat away from the semiconductor die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques for packaging semiconductor dies for increased thermal conductivity and simpler fabrication when compared to conventional semiconductor packaging techniques. The packaging techniques described herein may be suitable for various semiconductor devices, such as light-emitting diodes (LEDs), central processing units (CPUs), graphics processing units (GPUs), microcontroller units (MCUs), and digital signal processors (DSPs). Even though the figures described below may only depict two leads per package, it is to be understood that these are representative leads for illustration purposes and that semiconductor devices requiring more than two leads for external connection may be packaged according to the techniques described herein.

An Exemplary Thermally Conductive Package

Figure 3:
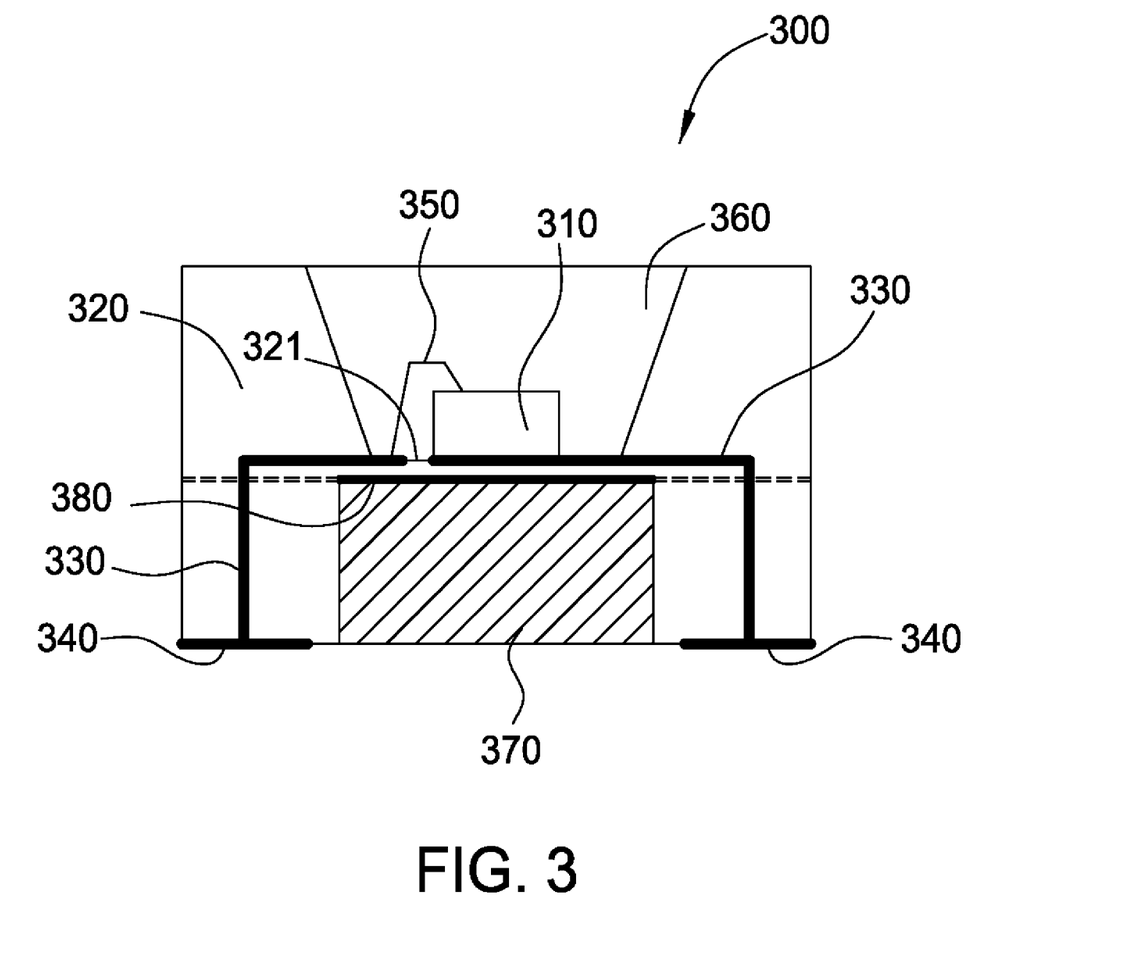
FIG. 3 depicts a cross-sectional view of a package for a semiconductor die, wherein the die is disposed within a top cavity of a ceramic substrate and a bottom cavity of the ceramic substrate contains one or more deposited metal layers in accordance with an embodiment of the invention.

FIG. 3 depicts a cross-sectional schematic view of a package 300 having a high thermal conductivity for a semiconductor die 310. The package 300 may comprise a ceramic substrate 320 with an upper cavity and a lower cavity. The shape of these cavities may be substantially circular, rectangular, or any other suitable shape depending on the shape or desired arrangement of the semiconductor die(s) 310 disposed in the upper cavity and features surrounding the lower cavity. The shape of the upper and lower cavity may be different from one another, and a thin ceramic layer 321 may separate the upper and lower cavities.

On the upper surface of the thin ceramic layer 321, a lead frame 330 having leads or terminals 340 for external electrical connection may be disposed. The semiconductor die(s) 310 may be coupled to the lead frame 330 with any suitable electrically conductive adhesive, such as solder, conductive epoxy, a eutectic bonding layer, and the like. Bond wires 350 comprising any suitable electrically conductive, reliable, and malleable metal, such as gold (Au) or aluminum (Al), may also be used to couple the semiconductor die(s) 310 to the lead frame, especially where a good thermal conduction path is not required. The terminals 340 may be composed of any suitable electrically conductive material, such as silver palladium (AgPd). Although the terminals 340 are depicted in FIG. 3 to be exposed through a bottom surface of the package 300, the terminals 340 of the lead frame 330 may alternatively be exposed through an upper surface of the package 300 for some embodiments.

For embodiments with a eutectic layer, materials—such as Sn, In, Pb, AuSn, CuSn, AgIn, CuIn, SnPb, SnInCu, SnAgIn, SnAg, SnZn, SnAgCu, SnZnBi, SnZnBiIn, and SnAgInCu—may couple the semiconductor die(s) 310 (or, as a specific example, a metal substrate of an LED die) with connection pads of the lead frame 330. The use of a eutectic layer may allow for eutectic bonds having high bonding strength and good stability at a low process temperature to form between the semiconductor die(s) 310 and the lead frame 330 during fabrication of the LED device, as disclosed in commonly owned U.S. patent application Ser. No. 11/382,296, filed May 9, 2006, entitled "Vertical LED with Eutectic Layer," herein incorporated by reference. Also, eutectics have a high thermal conductivity and a low coefficient of thermal expansion, which may lead to a decreased overall thermal resistance between the semiconductor die(s) 310 and the ambient environment.

The semiconductor die(s) 310 may be sealed within the upper cavity of the ceramic substrate 320 and protected by filling the upper cavity with any suitable encapsulation material 360. Typically, the encapsulation material 360 forms an opaque cover, but for some semiconductor devices, such as an LED device, the encapsulation material 360 may be optically transparent. For an optically transparent encapsulation material 360, materials such as epoxy, silicone, polyurethane, or other clear material(s) may be employed. Such optically transparent encapsulation materials may contain phosphorus for some embodiments in an effort to alter the emitted light wavelength of the LED device.

Adjacent to a lower surface of the thin ceramic layer 321, a heat dissipating metal structure 370 may be deposited comprising one or more metal layers and at least partially filling the lower cavity of the ceramic substrate 320. The thickness of the metal structure 370 may be greater than about 50 μm. The metal structure 370 may comprise a seed metal layer 380 disposed adjacent to the lower surface of the thin ceramic layer 321 and one or more electroplated metal layers disposed adjacent to the seed metal layer 380. The seed metal layer 380 may comprise any suitable metal for electroless chemical deposition, including silver (Ag), Au, tungsten (W), nickel (Ni), or alloys thereof. Likewise, the electroplated metal layer(s) may comprise any suitable metal for electrochemical deposition, such as copper (Cu), Ni, Au, or alloys thereof. Furthermore, different layers of the metal structure 370 may include different metal elements or metal alloys, even if the same deposition method is used to deposit the various metal layers.

By having the bottom surface of the heat dissipating metal structure 370 exposed at and flush with the bottom surface of the ceramic substrate 320, the metal structure 370 may act as a heat sink when the packaged semiconductor device is surface mounted to a pad of a printed circuit board (PCB), for example. The size of the lower cavity of the ceramic substrate 320 and the corresponding deposited metal layer(s) of the metal structure 370 may preferably be as large as possible within the confines of the ceramic substrate 320 in an effort to dissipate increased amounts of heat away from the semiconductor die(s) 310 when compared to conventional ceramic packages, such as that described in association with FIG. 1 above. Some insulative material should remain between the metal structure 370 and the terminals 340 in an effort to prevent electrical shorting.

Even though only one lower cavity for depositing a single heat dissipating metal structure 370 is depicted in FIG. 3, for example, those skilled in the art will recognize that embodiments of the package with multiple lower cavities, each receiving deposited metal layer(s), are within the scope of the invention. Such multiple lower cavities and their corresponding metal structures may have the same or different shapes.

An Exemplary Packaging Technique

Figure 4:
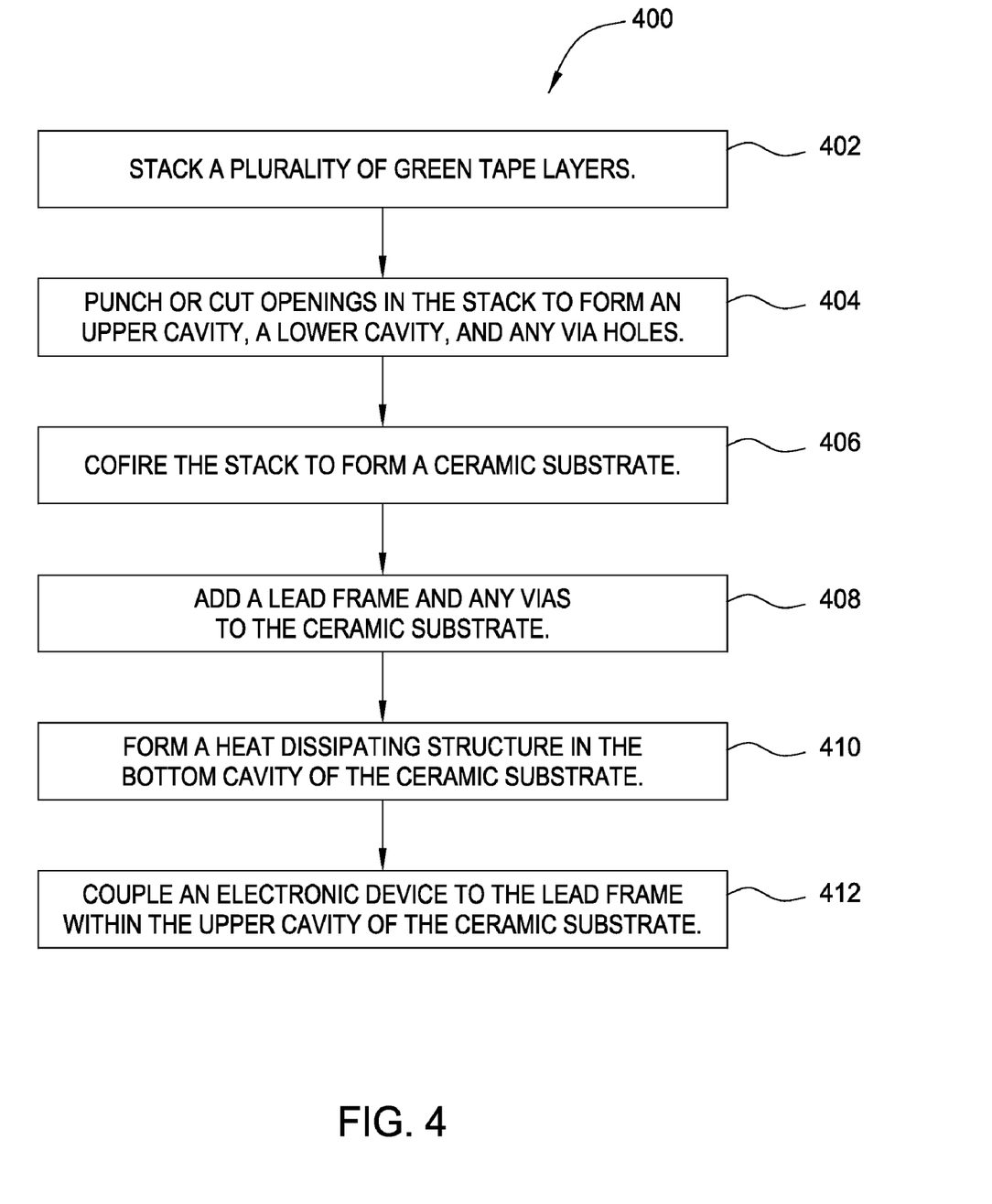
FIG. 4 is a flow diagram for fabricating a semiconductor device within the package of FIG. 3 in accordance with an embodiment of the invention.

To fabricate a packaged semiconductor device as described herein, such as the packaged device illustrated in FIG. 3, several steps may be performed according to the flow diagram 400 of FIG. 4.

In step 402, a plurality of layers of green ceramic tape may be stacked. Known to those skilled in the art, these green tape layers may be fabricated from ceramic powders of materials such as alumina ($Al_2O_3$), aluminum nitride (AlN), or glass-ceramic, which may be mixed with organic binders and a solvent. The mixture may then be spread out to form a layer of the mixture having a desired thickness on a flat surface. This layer may then be dried and cut to form a green tape of the particles in the binder, and a plurality of these green tape layers may be formed. Circuit patterns, such as connection pads, may be created by screen printing on one or more green tape layers.

Vias may be subsequently punched in the stacked tape layers in step 404 and, for some embodiments, filled with a conductor ink in order to connect the circuit patterns of different tape layers. Also, openings may be formed in the stack by cutting patterns for any desired hollowed out spaces, such as for the upper and lower cavities described above. For some embodiments, the plurality of green tape layers may be punched and/or cut before the individual layers are stacked.

In step 406, the stacked plurality of green tape layers may then be aligned, laminated, and fired to remove the organic materials and to sinter the metal patterns and ceramic tape layers, thereby forming a cofired ceramic substrate 320. The sintering profile may be dependent on the composition of the ceramic powders in the green tape layers. For example, 800-900° C. may be employed for sintering glass-ceramic, while alumina and aluminum nitride may be sintered at 1500-1800° C. With this method, temperatures greater than 1800° C may be used to fire AlN and other ceramic materials to form high temperature cofired ceramic (HTCC) substrates.

After the ceramic substrate 320 has cooled somewhat, designated holes in the ceramic substrate 320 may be filled with metal to form a lead frame 330 in step 408. Vias may also be formed in this manner.

Figure 5A:
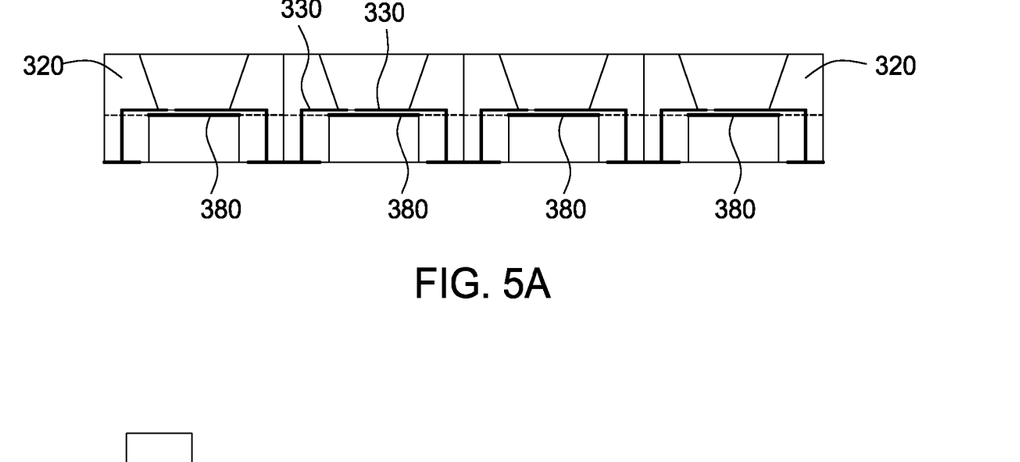
FIGS. 5A-C show electroplating one or more metal layers within the bottom cavities of a plurality of ceramic substrates in accordance with an embodiment of the invention.

Once the lead frame has been added, the heat dissipating metal structure 370 may be formed in step 410 by depositing one or more metal layers in the lower cavity of the ceramic substrate 320 using any suitable deposition technique. Typically, the lower cavity of the ceramic substrate 320 is completely filled by the deposited metal layer(s), but for some embodiments, the metal structure 370 may only partially fill the lower cavity. For some embodiments, as shown in FIG. 5A, a seed metal layer 380 may be deposited via electroless plating to act as a primer for subsequent electroplating.

Figure 5B:
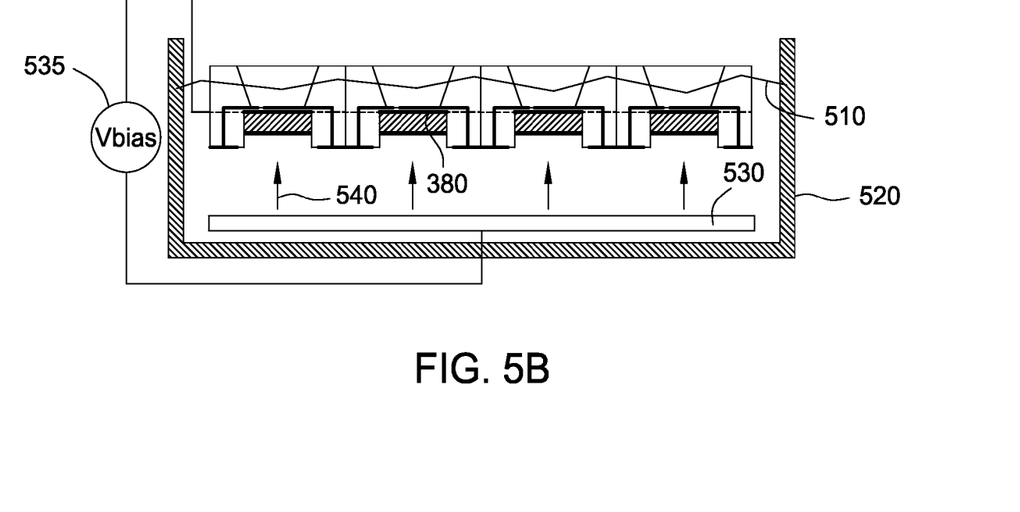

To electroplate one or more additional metal layers adjacent to the seed metal layer 380, the plurality of ceramic substrates 320 may be at least partially immersed in a plating solution 510 confined within an electroplating tank 520 as shown in FIG. 5B. The electroplating tank 520 may also contain a metal plate 530 composed of whatever metal element or alloy is desired for the present metal layer of the heat dissipating metal structure 370 being electroplated. For example, if a copper layer is desired for the next metal layer of the metal structure 370 to be deposited, then the metal plate 530 should comprise copper. Once an electrical bias is applied between the seed metal layer 380 and the metal plate 530, metal ions 540 may be transferred from the metal plate 530 to be deposited on the surface of the seed metal layer 380 or any exposed deposited metal layers to form an additional deposited metal layer. The electroplating process may be repeated using metal plates 530 composed of different metal elements or alloys to deposit different metal layers.

Figure 5C:
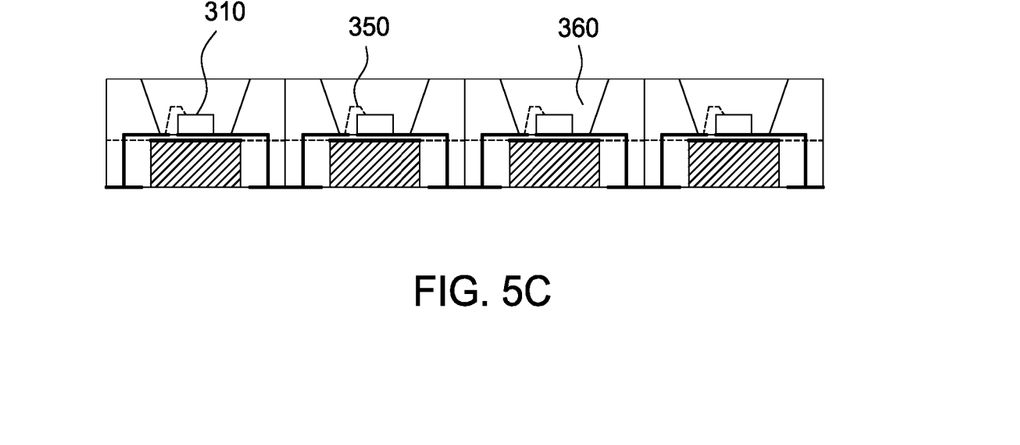

Once the desired metal layer(s) have been deposited in step 410 to form the heat dissipating structure 370, one or more semiconductor dies 310 may be disposed in the upper cavity of the ceramic substrate 320 and coupled to the lead frame in step 412 as shown in FIG. 5C. Coupling the semiconductor die(s) 310 to the lead frame 330 may be accomplished as described above with bond wires 350 and/or any suitable electrically conductive adhesive, such as solder, conductive epoxy, a eutectic bonding layer, and the like. For some embodiments, encapsulation material 360 may be added and at least partially fill the upper cavities of the ceramic substrates 320 after the semiconductor dies 310 have been connected.

Other Exemplary Thermally Conductive Packages

Figure 6:
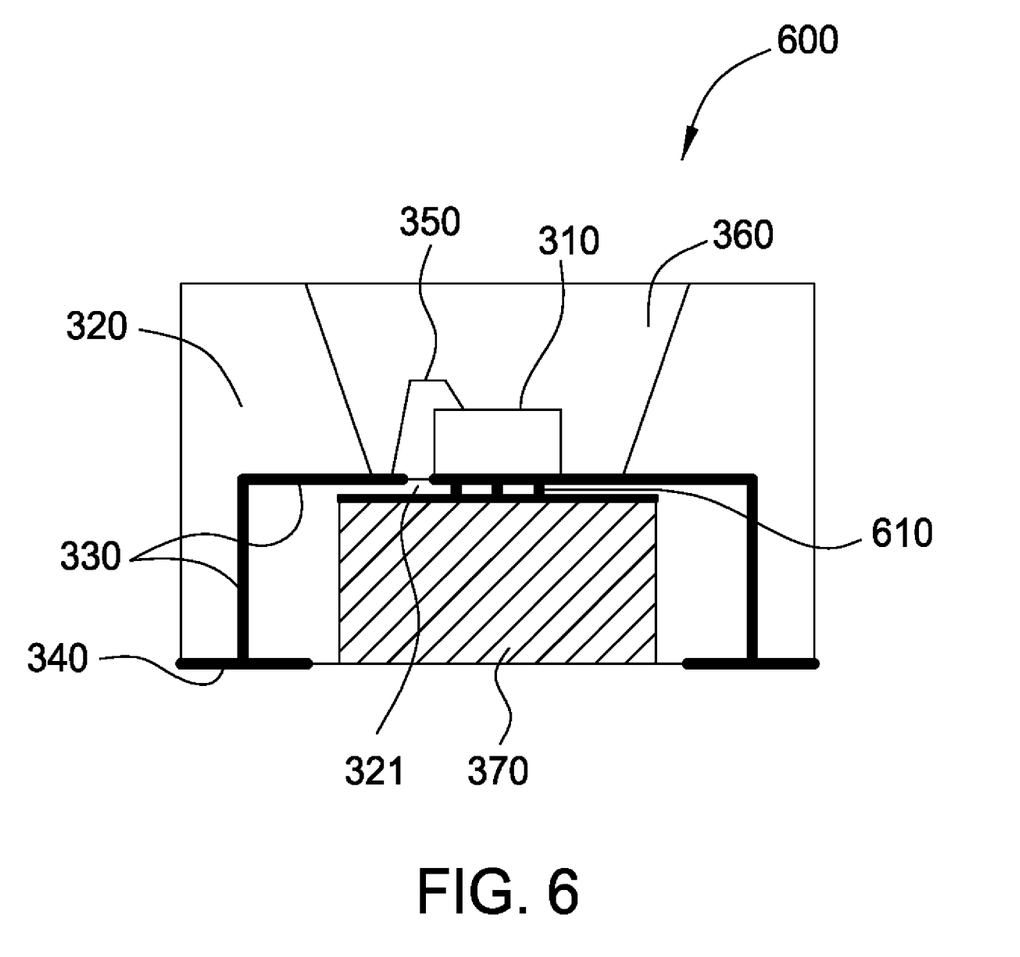
FIG. 6 illustrates a cross-sectional schematic view of a package for a semiconductor die, wherein the die is disposed within a top cavity of a ceramic substrate and coupled by thermal vias to one or more deposited metal layers disposed within a bottom cavity of the ceramic substrate in accordance with an embodiment of the invention.

Referring now to the cross-sectional schematic view of the package 600 of FIG. 6, some packages may have thermal vias 610 disposed in the thin ceramic layer 321 separating the upper and lower cavities of the ceramic substrate 320. Such thermal vias 610 may extend from an upper surface to a lower surface of the thin ceramic layer 321 and be disposed in an area of the thin ceramic layer 321 underneath a location designated for the semiconductor die(s) 310. Designed to enhance thermal conduction from the die(s) 310 to the heat dissipating metal structure 370, these thermal vias 610 may be electrically conductive or non-conductive.

Figure 7:
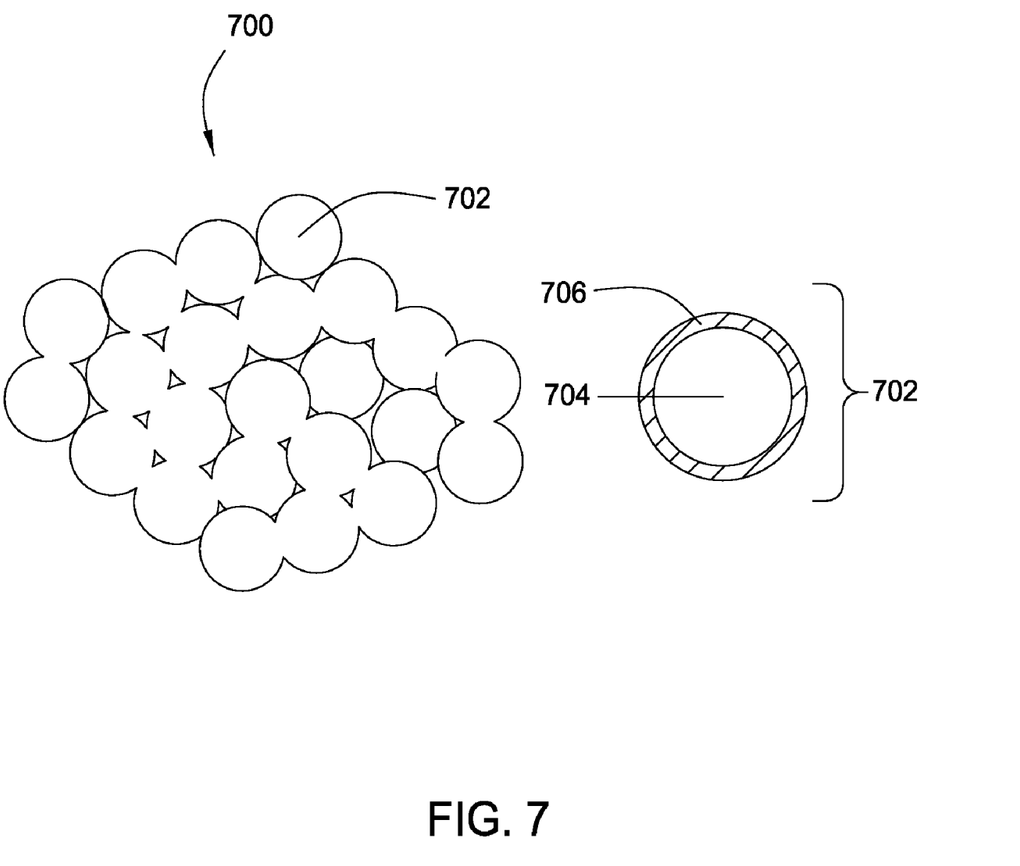
FIG. 7 portrays composite material composed of alumina-coated silver powder for a thermal via in accordance with an embodiment of the invention.

One type of suitable electrically non-conductive material for filling the thermal via holes may be a paste 700 of composite material, such as alumina-coated silver powder 702 as illustrated in FIG. 7. Individual constituents of alumina-coated silver powder 702 comprise silver powder 704 coated with an alumina layer 706. Such a composite may possess a high thermal conductivity (as high as 430 W/m·K) and a high electrical resistance.

Figure 8:
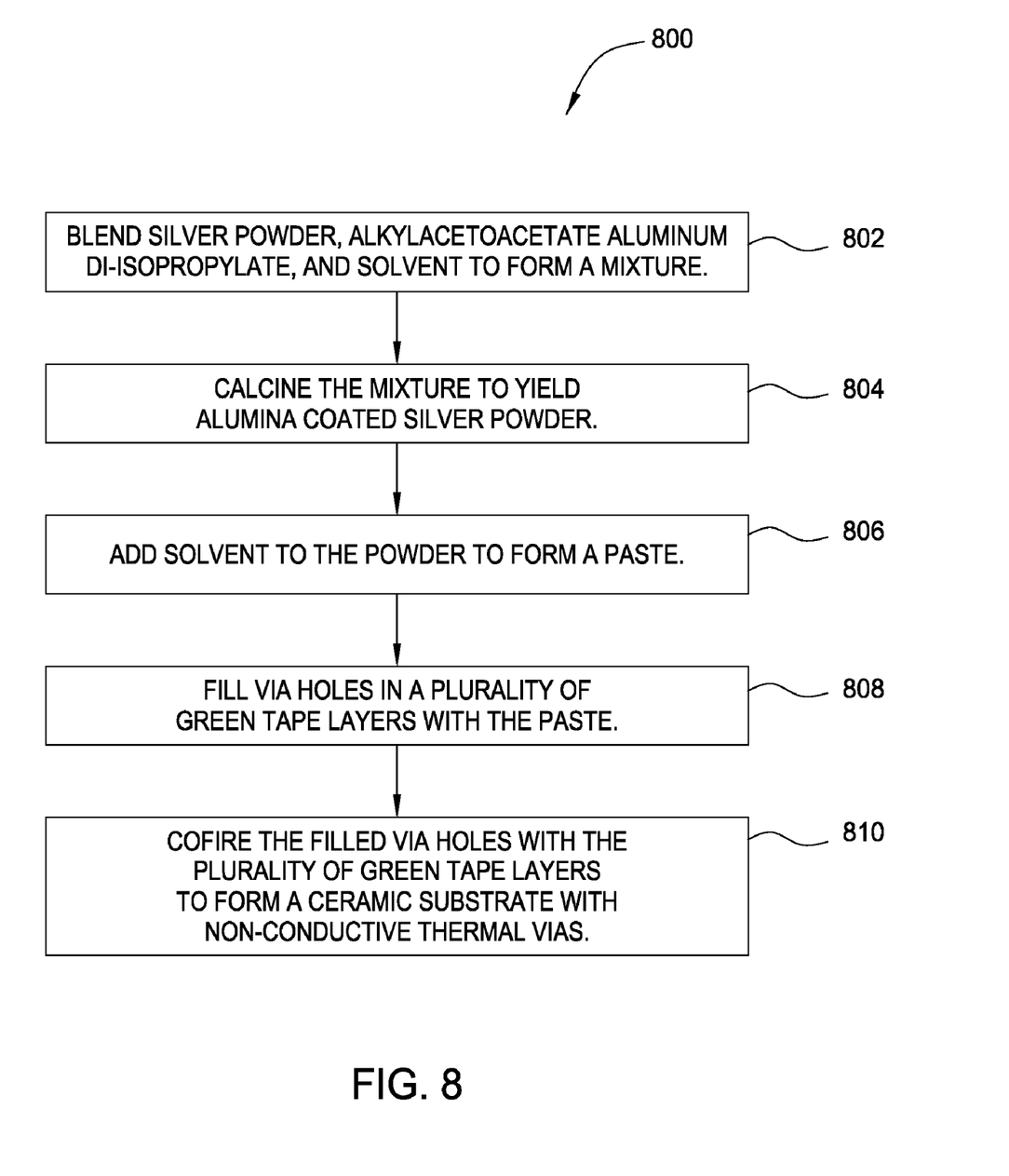
FIG. 8 is a flow diagram for producing a non-electrically-conductive thermal via using the composite material of FIG. 7 in accordance with an embodiment of the invention.

To form a ceramic substrate having thermal vias 610 filled with alumina-coated silver powder 702, silver powder 704 may be blended with alkylacetoacetate aluminum di-isopropylate and solvent in step 802 of the flow diagram 800 of FIG. 8. Organic binders may also be added to the mixture for some embodiments. The resulting mixture may be dried and calcined in step 804 to yield alumina-coated silver powder 702. In step 806, a vehicle solvent may be added to the powder 702 to form a paste 700. Designated via holes in a plurality of green tape layers may be filled with the paste 700 by using a filling machine in step 808. In step 810, a stack of the plurality of green tape layers filled with the paste 700 may be cofired to form a ceramic substrate with electrically non-conductive thermal vias.

Figure 9:
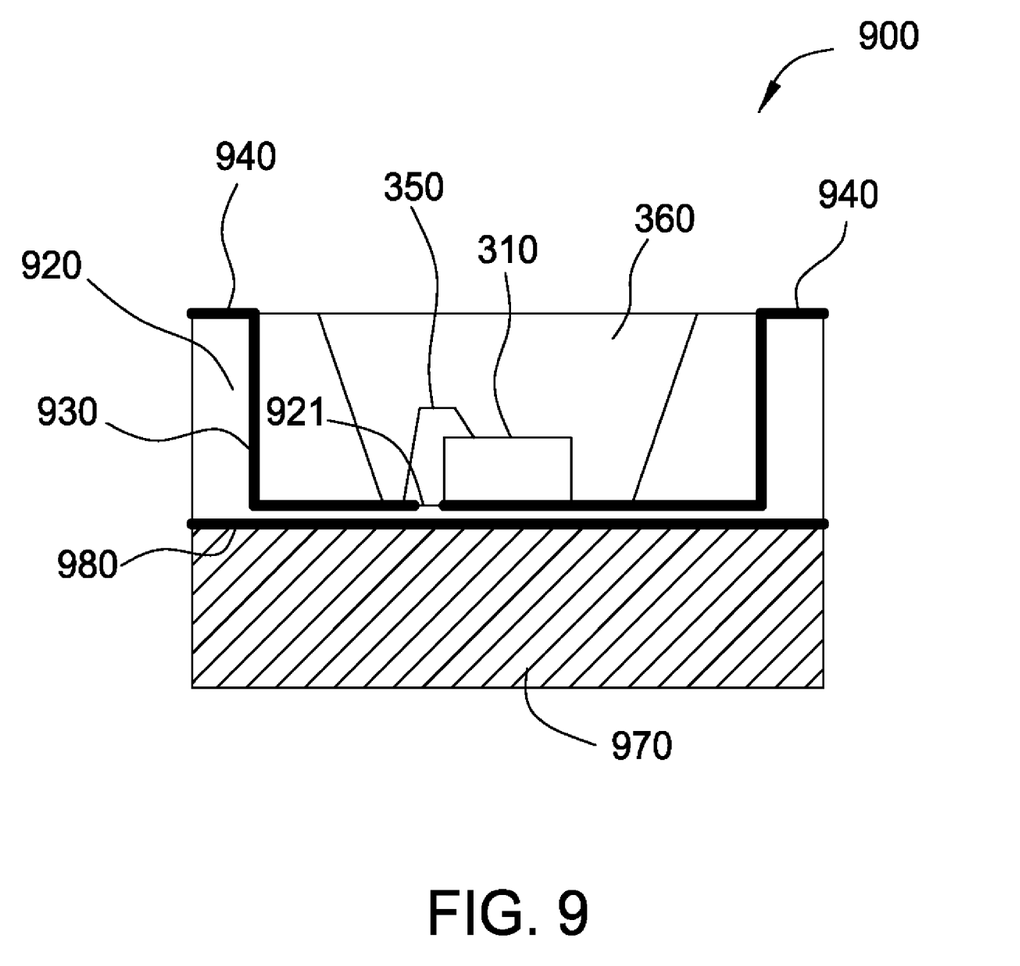
FIG. 9 illustrates a cross-sectional schematic view of a package for a semiconductor die, wherein the die is disposed within a cavity of a ceramic substrate, the leads are exposed through the upper surface of the ceramic substrate, and one or more metal layers have been deposited on the bottom surface of the ceramic substrate in accordance with an embodiment of the invention.

Referring now to FIG. 9, some embodiments of a packaged semiconductor device 900 may employ a ceramic substrate 920 without a lower cavity. For such embodiments, the semiconductor die(s) 310 may be coupled to a lead frame 930 with terminals 940 exposed through an upper surface of the ceramic substrate 920. One or more metal layers of a heat dissipating metal structure 970 may be deposited along the width of the ceramic substrate adjacent to the lower surface of the thin ceramic layer 921 separating the upper cavity from the bottom surface of the ceramic substrate 920. Although not shown in FIG. 9, thermal vias may be disposed in the thin ceramic layer 921 to dissipate heat from the semiconductor die(s) 310.

Figure 10A:
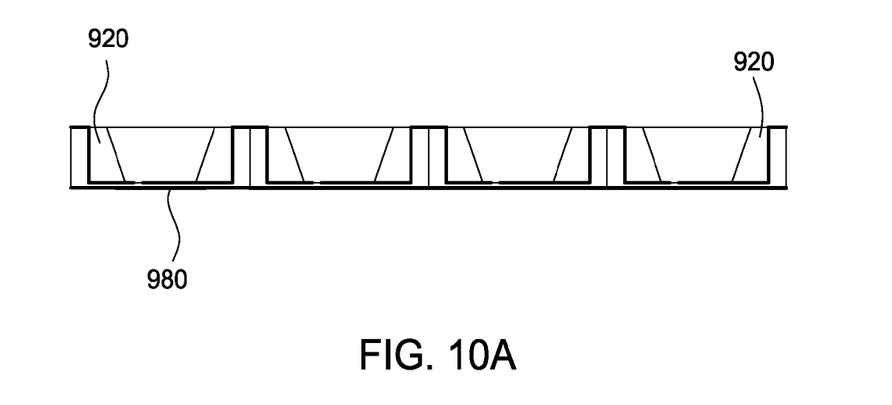
FIGS. 10A-C show electroplating one or more metal layers onto the bottom surface of a plurality of ceramic substrates in accordance with an embodiment of the invention.

To fabricate the packaged semiconductor device 900 of FIG. 9, a plurality of ceramic substrates 920 with lead frames 930 and vias may be formed as described above. For some embodiments, as shown in FIG. 10A, a seed metal layer 980 may be deposited via electroless plating to act as a primer for subsequent electroplating.

Figure 10B:
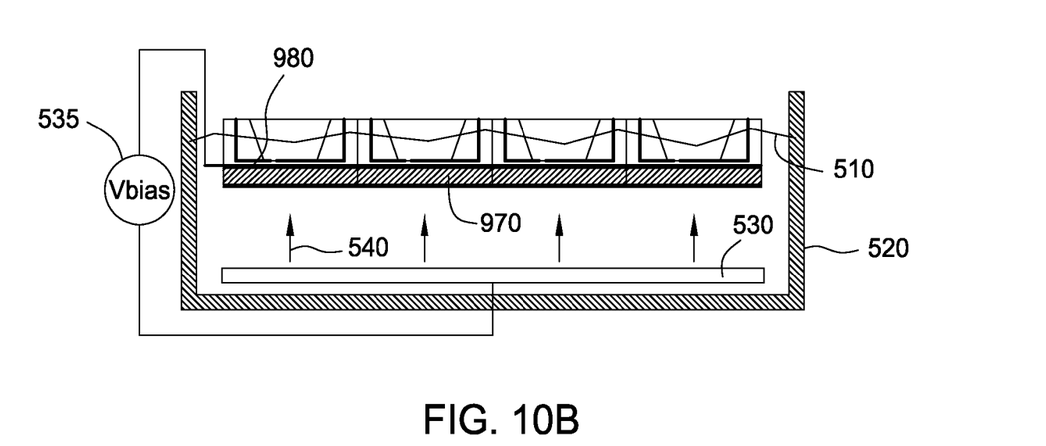

To electroplate one or more additional metal layers adjacent to the seed metal layer 980, the plurality of ceramic substrates 920 may be at least partially immersed in a plating solution 510 confined within an electroplating tank 520 as shown in FIG. 10B. The electroplating tank 520 may also contain a metal plate 530 composed of whatever metal element or alloy is desired for the present metal layer of the heat dissipating metal structure 970 being electroplated. For example, if a nickel layer is desired for the next metal layer of the metal structure 970 to be deposited, then the metal plate 530 should comprise nickel. Once an electrical bias 535 is applied between the seed metal layer 980 and the metal plate 530, metal ions 540 may be transferred from the metal plate 530 to be deposited on the surface of the seed metal layer 980 or any exposed deposited metal layers to form an additional deposited metal layer. The electroplating process may be repeated using metal plates 530 composed of different metal elements or alloys to deposit different metal layers.

Figure 10C:
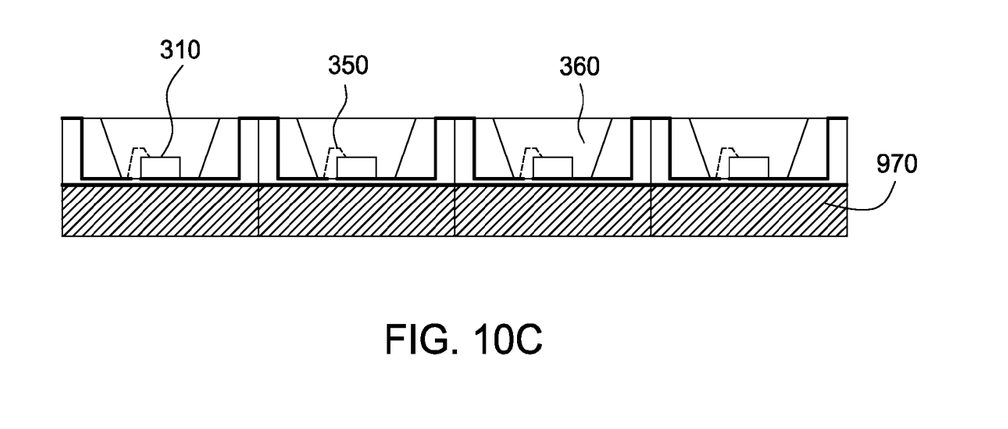

Once the desired metal layer(s) have been deposited to form the heat dissipating structure 970, one or more semiconductor dies 310 may be disposed in the upper cavity of the ceramic substrate 920 and coupled to the lead frame 930 in as shown in FIG. 10C. Coupling the semiconductor die(s) 310 to the lead frame 930 may be accomplished as described above with bond wires 350 and/or any suitable electrically conductive adhesive, such as solder, conductive epoxy, a eutectic bonding layer, and the like. For some embodiments, encapsulation material 360 may be added and at least partially fill the upper cavities of the ceramic substrates 920 after the semiconductor dies 310 have been connected.

The thermal resistance ($\theta$) of a substrate or package underneath the semiconductor die 310 may be approximated by $\theta = t/kA$, where t is the thickness of the package below the die usually on the order of µm, k is the thermal conductivity of the package in W/m·K, and A is the area of the package below the die. Table 1 below illustrates the thermal conductivity for packages composed solely of aluminum nitride (AlN), low temperature co-fired ceramics (LTCC) with and without thermal vias, or alumina ($Al_2O_3$) in the first four rows. In the last row, a thermal conductivity range of a ceramic substrate with a heat dissipating metal structure comprising one or more deposited metal layers according to various embodiments of the invention is provided.

TABLE 1

| | Material of Substrate | Thermal Conductivity of Substrate (W/m · K) |
|---|---|---|
| Prior Art | AlN | 170 |
| | LTCC* | 3 |
| | Alumina | 20 |
| | LTCC* with thermal vias | 50 |
| Present Invention | Ceramic substrate with plated copper | 50 to 350 |

*Low Temperature Cofired Ceramics

From Table 1, the thermal conductivity (about 50 to 350 W/m·K) of the ceramic package according to embodiments of the present invention is significantly greater than the thermal conductivity of the LTCC package without thermal vias (3 W/m·K) and the alumina package (20 W/m·K) of the prior art. Even when compared to the thermal conductivity (50 W/m·K) of the conventional LTCC package with thermal vias, the thermal conductivity of the ceramic package according to embodiments of the present invention is on par at a minimum. Furthermore, the thermal conductivity of the ceramic package according to some embodiments of the present invention may significantly exceed the thermal conductivity (170 W/m·K) of the AlN package. This increased thermal conductivity may be attributed primarily to the deposited heat dissipating metal structure with a higher thermal conductivity than the LTCC or alumina placed underneath semiconductor dies in the prior art. Having a higher thermal conductivity should allow the ceramic package described herein to dissipate more heat away from the semiconductor die(s) when compared to conventional ceramic packages.

While the foregoing is directed to embodiments of the present invention, other and further embodiments of the invention may be devised without departing from the basic scope thereof, and the scope thereof is determined by the claims that follow.

The invention claimed is:

1. A packaged semiconductor device comprising:
  a ceramic substrate having an upper surface and a lower surface;
  a semiconductor die disposed above the upper surface; and
  one or more metal layers deposited adjacent to the lower surface for dissipating heat away from the semiconductor die, wherein a thin ceramic layer of the ceramic substrate separates the one or more metal layers from the semiconductor die, wherein the one or more metal layers comprise at least one electroplated metal layer.

2. The device of claim 1, wherein the upper surface is one surface of an upper cavity of the ceramic substrate and the semiconductor die is disposed within the upper cavity.

3. The device of claim 2, wherein the upper cavity is at least partially filled with an encapsulation material.

4. The device of claim 1, wherein the lower surface is one surface of a lower cavity of the ceramic substrate.

5. The device of claim 4, wherein the one or more metal layers at least partially fill the lower cavity.

6. The device of claim 1, wherein the one or more metal layers comprise a seed metal layer adjacent to the lower surface and the at least one electroplated metal layer is adjacent to the seed metal layer.

7. The device of claim 1, wherein the semiconductor die is coupled to a lead frame disposed within the ceramic substrate.

8. The device of claim 7, wherein leads of the lead frame for external connection are exposed through an upper portion of the ceramic substrate.

9. The device of claim 1, further comprising a plurality of thermal vias disposed in the ceramic substrate for transferring heat from the semiconductor die to the metal layers.

10. The device of claim 9, wherein the thermal vias are electrically conductive.

11. The device of claim 9, wherein the thermal vias comprise alumina coated silver powder.

12. The device of claim 1, wherein the ceramic substrate comprises AlN or $Al_2O_3$.

13. The device of claim 1, wherein the metal layers comprise at least one of Cu, Ni, Au, Ag, W, and alloys thereof.

14. The device of claim 1, wherein the thickness of the one or more metal layers is greater than 50 µm.

15. The device of claim 1, wherein the semiconductor die is a light-emitting diode (LED) die.

16. A packaged semiconductor device comprising:
   a ceramic substrate having an upper surface and a lower surface;
   a lead frame disposed within the ceramic substrate;
   a semiconductor die disposed above the upper surface of the ceramic substrate and coupled to the lead frame; and
   two or more metal layers deposited adjacent to the lower surface of the ceramic substrate for dissipating heat away from the semiconductor die.

17. The device of claim 16, wherein the upper surface is one surface of an upper cavity of the ceramic substrate and the semiconductor die is disposed within the upper cavity.

18. The device of claim 17, wherein the upper cavity is at least partially filled with an encapsulation material.

19. The device of claim 16, wherein the lower surface is one surface of a lower cavity of the ceramic substrate.

20. The device of claim 19, wherein the two or more metal layers at least partially fill the lower cavity.

21. The device of claim 16, wherein the metal layers comprise a seed metal layer adjacent to the lower surface and one or more additional metal layers electroplated adjacent to the seed metal layer.

22. The device of claim 16, wherein leads of the lead frame for external connection are exposed through an upper portion of the ceramic substrate.

23. The device of claim 16, further comprising a plurality of thermal vias disposed in the ceramic substrate for transferring heat from the semiconductor die to the metal layers.

24. The device of claim 23, wherein the thermal vias are electrically conductive.

25. The device of claim 23, wherein the thermal vias comprise alumina coated silver powder.

26. The device of claim 16, wherein the ceramic substrate comprises AlN or $Al_2O_3$.

27. The device of claim 16, wherein the metal layers comprise at least one of Cu, Ni, Au, Ag, W, and alloys thereof.

28. The device of claim 16, wherein the thickness of the two or more metal layers is greater than 50 µm.

29. The device of claim 16, wherein the semiconductor die is a light-emitting diode (LED) die.

* * * * *